(12) United States Patent
Chen et al.

(10) Patent No.: US 9,897,640 B2
(45) Date of Patent: Feb. 20, 2018

(54) FAULT ARC DETECTION METHOD AND DETECTION DEVICE

(71) Applicant: SIEMENS AKTIENGESELLSCHAFT, Munich (DE)

(72) Inventors: Wei Gang Chen, Shanghai (CN); Feng Du, Shanghai (CN); Sebastian Haas, Weigendorf/Hoegen (DE); Yue Zhuo, Beijing (CN)

(73) Assignee: Siemens Aktiengesellschaft, Munich (DE)

( * ) Notice: Subject to any disclaimer, the term of this patent is extended or adjusted under 35 U.S.C. 154(b) by 164 days.

(21) Appl. No.: 14/726,755

(22) Filed: Jun. 1, 2015

(65) Prior Publication Data

US 2015/0346261 A1    Dec. 3, 2015

(30) Foreign Application Priority Data

May 30, 2014  (CN) .......................... 2014 1 0240567

(51) Int. Cl.
    *G01R 31/02*    (2006.01)
    *H02H 3/16*     (2006.01)
    *H02H 1/00*     (2006.01)

(52) U.S. Cl.
    CPC ......... *G01R 31/025* (2013.01); *H02H 1/0015* (2013.01); *H02H 3/16* (2013.01)

(58) Field of Classification Search
    CPC ....... G01R 31/025; H02H 1/0015; H02H 3/16
    See application file for complete search history.

(56) References Cited

U.S. PATENT DOCUMENTS

| 5,805,397 A | 9/1998 | MacKenzie | |
|---|---|---|---|
| 2010/0204933 A1* | 8/2010 | Lagree | H02H 7/30 702/58 |
| 2013/0073103 A1* | 3/2013 | Kao | G05B 15/02 700/291 |
| 2014/0168843 A1* | 6/2014 | Privitera | G01R 31/025 361/93.1 |

FOREIGN PATENT DOCUMENTS

CN    102798753 A    11/2012

* cited by examiner

*Primary Examiner* — Scott Bauer
(74) *Attorney, Agent, or Firm* — Laurence Greenberg; Werner Stemer; Ralph Locher (57) ABSTRACT

A fault arc detection method includes: sampling an instantaneous current value of a circuit; using the instantaneous current value to predict a current peak value and, when the predicted current peak value is greater than a predetermined threshold, determining that a first energy fault arc is to appear; and comparing a time domain or frequency domain feature of the instantaneous current value with a reference time domain feature or a reference frequency domain feature of the current of a fault arc of the circuit. When the similarity between the time domain or frequency domain feature and the reference time or reference frequency domain feature of the current of the fault arc reaches a predetermined range, a second energy fault arc is determined to appear. The method and detection device detect the occurrence of a fault arc early and they are able to distinguish different types of fault arcs.

13 Claims, 5 Drawing Sheets

FAULT ARC DETECTION METHOD AND DETECTION DEVICE

CROSS-REFERENCE TO RELATED APPLICATION

This application claims the priority, under 35 U.S.C. § 119, of Chinese patent application CN 201410240567.6, filed May 30, 2014; the prior application is herewith incorporated by reference in its entirety.

BACKGROUND OF THE INVENTION

Field of the Invention

The present invention relates to the technical field of circuits, and in particular, to a circuit fault detection method and device.

Background Art

Electrical fire accidents caused by power utilization increase year by year and have become the main cause of fire accidents. The existing over-current protection appliances and residual-current protection appliances cannot reduce the electrical fire accident hazards caused by arc faults, and this type of electrical fire accidents accounts for about 30% of all the electrical fire accidents. An arc fault detection device is a novel arc fault protection appliance, and it can detect arc faults in an electrical circuit and open the circuit before an electrical fire accident is caused, thereby effectively preventing electrical fire accidents caused by arc faults in a terminal circuit. An arc fault circuit breaker makes up for the shortcomings of other protection devices, and greatly improves the level of protection against electrical fire accidents.

Some of the existing arc fault detection devices and methods utilize a physical feature such as the intensity of arc light plus an over current amplitude and an over-current change rate which are detected in real time as an identification feature of a fault arc. That method has the following defects:

Firstly, the detection of the over-current amplitude or over-current change rate causes the time of identifying the arc to be late. Meanwhile, the intensity of the arc light of some low-energy arcs is too small to identify. Therefore, these low-energy fault arcs cannot be identified at an early stage. These low-energy fault arcs will develop into high-energy fault arcs, thereby bringing greater impairments. Therefore, it is always desirable to detect the occurrence of a fault arc early so as to trip and extinguish the arc in time when the fault arc is still not sufficient for damaging the circuit breaker apparatus, thereby protecting the workers, the electrical power apparatus and the electrical power system, and prolonging the service life of the electrical power apparatus and the electrical power system. Meanwhile, the level of protection against electrical fire accidents is improved.

Secondly, in a normal electrical line, there exist a large amount of normal arcs, for example, arcs generated from the operation of a switch appliance, arcs generated by an electrical brush of an electric motor, arcs generated by an arc welding machine, arcs generated during the plugging-in of a plug/socket, etc. In addition, many electronic apparatuses will also generate current waveforms and voltage waveforms similar to those of fault arcs. Therefore, the arc fault circuit breaker must be able to distinguish normal arcs from fault arcs accurately; only in this way can protection be provided rapidly and effectively, and the occurrence of erroneous operations can be prevented at the same time, and this is the key technology of the arc fault circuit breaker.

Finally, for an electrical power system having a ZSI (Zone-Selective Interlocking) function, it is more important to detect the occurrence of fault arcs early. In an electrical power system having the ZSI function, circuit breakers correspond to different levels of circuits, and when a failure occurs in a downstream circuit, a circuit breaker corresponding to the downstream circuit trips rapidly and locks an upstream circuit at the same time, so as to realize selective cooperation between levels. However, if the occurrence of fault arcs cannot be detected early, advance current limiting cannot be realized; thus, it is possible that the case where two circuits of different levels are protected at the same time occurs, influencing the implementation of the ZSI function.

BRIEF SUMMARY OF THE INVENTION

It is accordingly an object of the invention to provide a circuit fault detection method and device which overcomes the above-mentioned and other disadvantages of the heretofore-known devices and methods of this general type and which provides for a fault circuit detection method and device which can predict the occurrence of a fault arc in time before the fault arc appears or an accident is caused.

With the foregoing and other objects in view there is provided, in accordance with the invention, a fault arc detection method, which comprises:

(a) sampling an instantaneous current value of a circuit;

(b) using the instantaneous current value to predict a current peak value and, when the predicted current peak value is greater than a predetermined threshold, determining that a first energy fault arc is to appear; and (c) comparing a time domain feature or a frequency domain feature of the instantaneous current value with a reference time domain feature or a reference frequency domain feature of the current of a fault arc of the circuit and, if a similarity between the time domain feature or the frequency domain feature of the instantaneous current and the reference time domain feature or the reference frequency domain feature of the current of the fault arc of the circuit reaches a predetermined range, determining that a second energy fault arc appears.

In accordance with an added feature of the invention, the above-noted step (b) further comprises:

(b1) acquiring a current integral value corresponding to a sampling time of the instantaneous current value; and (b2) using the instantaneous current value and the current integral value to predict the current peak value $I_{peak}$ of the circuit based on an Ohm's law equation for the circuit; and if the current peak value $I_{peak}$ of the circuit is greater than the predetermined threshold, determining that the first energy fault arc is to appear.

In other words, one embodiment of the present invention provides for a fault arc detection method, the method comprising: (a) sampling an instantaneous current value of a circuit; (b) using the instantaneous current value to predict a current peak value and, when the predicted current peak value is greater than a predetermined threshold, determining that a first energy fault arc is to appear; and (c) comparing a time domain feature or a frequency domain feature of the instantaneous current value with a reference time domain feature or a reference frequency domain feature of the current of a fault arc of the circuit and, when the similarity between the time domain feature or the frequency domain feature of the instantaneous current and the reference time domain feature or the reference frequency domain feature of the current of the fault arc of the circuit reaches a predetermined range, determining that a second energy fault arc appears.

The above-mentioned fault arc detection method is able to predict the occurrence of a fault arc in time before the current arrives at a peak value and is able to distinguish different types of fault arcs. The approach of utilizing the prediction of the current peak value in step (b) needs a shorter time than the approach of feature comparison in step (c), and thus the above-mentioned algorithm is able to detect a short circuit fault arc early by means of prediction. In comparison with the existing method of detecting the over-current amplitude and over-current change rate in real time, the time for the above-mentioned method of the embodiments of the present invention to detect the fault arc is earlier. Since the fault arc can be predicted earlier, the present invention is able to reduce the damage caused by large current fault arcs. Meanwhile, the present invention is also able to identify small current fault arcs, and is thus able to avoid the small current fault arcs developing into large current fault arcs. In addition, by distinguishing a short circuit fault arc from a small current fault arc, an arc extinguishing operation can be avoided when a small current fault arc appears.

Preferably, the method further comprises: sampling a physical feature of the arc of the circuit, comparing the sampled physical feature of the arc of the circuit with a reference physical feature library of the fault arc of the circuit, and when the similarity between the sampled physical feature and a reference physical feature of the fault arc of the circuit reaches a predetermined range and it is determined in the step (b) that the first energy fault arc is to appear, causing the circuit breaker and the arc extinguisher on the circuit to act. A short circuit current will not necessarily bring about high-energy fault arcs, and the above-mentioned embodiment is able to determine whether a high-energy fault arc is to occur more accurately by combining the predicted peak current and the physical feature of the arc.

With the above and other objects in view there is provided, in accordance with the invention, a fault arc detection device, comprising:

a current sampling module for sampling an instantaneous current value of a circuit;

a first energy fault arc determination module configured for using the instantaneous current value to predict a current peak value and, when the predicted current peak value is greater than a predetermined threshold, determining that a first energy fault arc is to appear; and a second energy fault arc determination module configured for comparing a time domain feature or a frequency domain feature of the instantaneous current value with a reference time domain feature or a reference frequency domain feature of the current of a fault arc of the circuit and, when the similarity between the time domain feature or the frequency domain feature of the instantaneous current and the reference time domain feature or the reference frequency domain feature of the current of the fault arc of the circuit reaches a predetermined range, for determining that a second energy fault arc appears.

In other words, there is provided a fault circuit detection device with: a current sampling module for sampling an instantaneous current value of a circuit; a first energy fault arc determination module for using the instantaneous current value to predict a current peak value and, when the predicted current peak value is greater than a predetermined threshold, determining that a first energy fault arc is to appear; and a second energy fault arc determination module for comparing a time domain feature or a frequency domain feature of the instantaneous current value with a reference time domain feature or a reference frequency domain feature of the current of a fault arc of the circuit and, when the similarity between the time domain feature or the frequency domain feature of the instantaneous current and the reference time domain feature or the reference frequency domain feature of the current of the fault arc of the circuit reaches a predetermined range, determining that a second energy fault arc appears.

Other features which are considered as characteristic for the invention are set forth in the appended claims.

Although the invention is illustrated and described herein as embodied in a circuit fault detection method and device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE INVENTION

Figure 1:
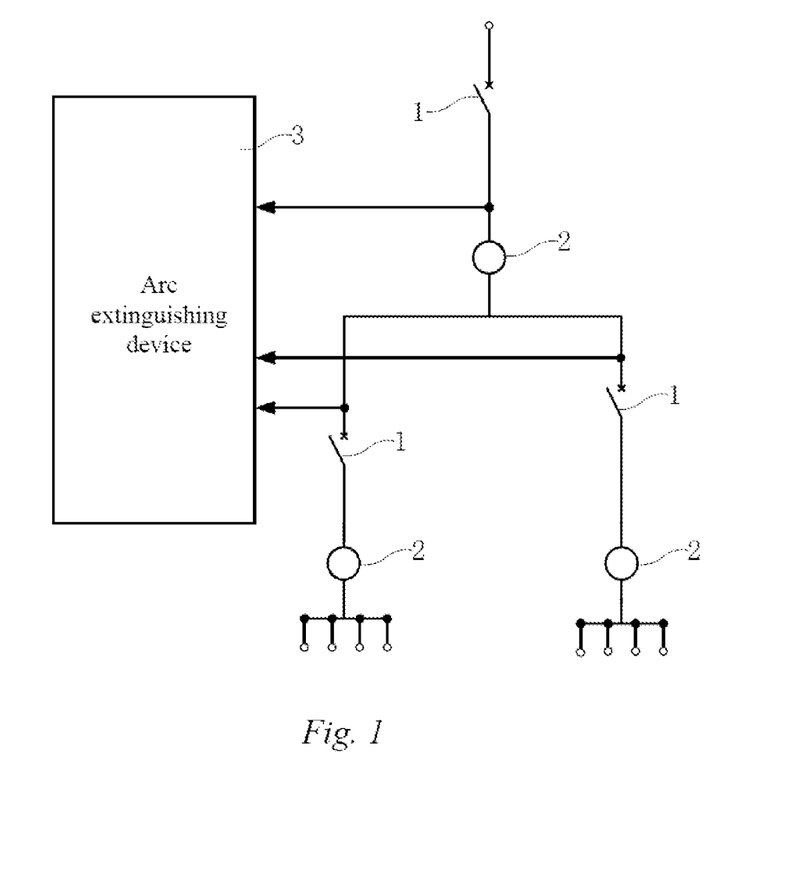
FIG. 1 is a structural schematic diagram of an electrical power system which applies a fault arc detection method of the present invention.

Referring now to the figures of the drawing in detail and first, particularly, to FIG. 1 thereof, there is shown a schematic diagram of an electrical power system which implements a fault arc detection method according to the present invention. The current flows from above into the electrical power system and flows from below out of the electrical power system. For convenience of description below, here, an upstream branch of the electrical power system is referred to as circuit 1 and two downstream branches are respectively referred to as circuit 2 and circuit 3. The designations "upstream" and "downstream" here are in terms of the direction of the current. Circuits 1, 2 and 3 are all provided with a circuit breaker 1 for opening or closing that circuit and a current sensor 2 for detecting an instantaneous current of that circuit. The circuit breaker 1 may be an air circuit breaker (ACB), a low voltage circuit breaker such as a molded case circuit breaker (MCCB), a miniature circuit breaker (MCB), or the like. The current sensor 2 may be a hollow-core current transformer, an iron-core current transformer or a Hall current sensor, which can be installed on each circuit breaker 1. The electrical power system is further provided with an arc extinguishing device 3 which is any device that is able to extinguish a fault arc rapidly when the arc occurs. By way of example, it may be an arc extinguishing device which can generate a metallic short circuit. When the arc extinguishing device 3 receives an arc extinguishing instruction sent from a certain circuit, it will act.

Figure 2:
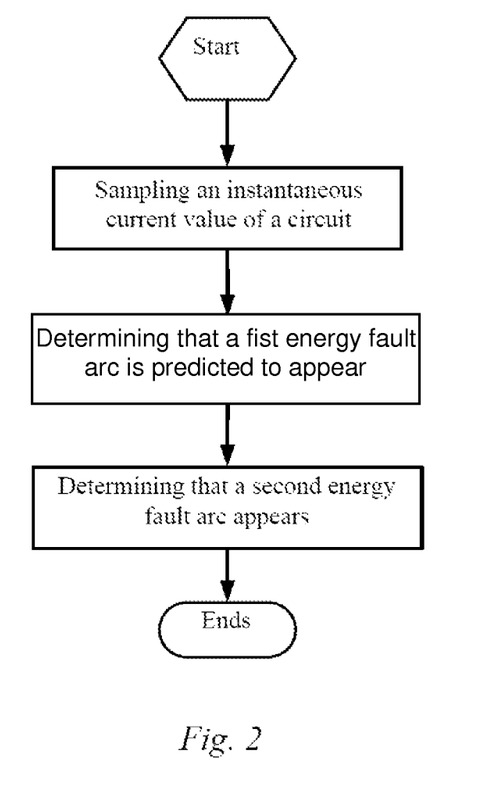
FIG. 2 is a flowchart of a fault arc detection method in the embodiments of the present invention.

FIG. 2 is a flowchart of a fault arc detection method in the embodiments of the present invention. The fault arc detection method comprises the following steps: step (a) sampling an instantaneous current value of a circuit; step (b) using the instantaneous current value to predict a current peak value and, when the predicted current peak value is greater than a predetermined threshold, determining that a first energy fault arc is to appear, wherein the first energy fault arc is a high-energy fault arc caused by a short circuit failure here; and step (c) comparing a time domain feature or a frequency domain feature of the instantaneous current value with a reference time domain feature or a reference frequency domain feature of the current of a fault arc of the circuit and, when the similarity between the time domain feature or the frequency domain feature of the instantaneous current and the reference time domain feature or the reference frequency domain feature of the current of the fault arc of the circuit reaches a predetermined range, determining that a second energy fault arc appears.

It should be noted here that, in the present invention, the execution sequence of steps (b) and (c) can be exchanged, i.e. step (b) can be executed first and then step (c) is executed, and vice versa. Furthermore, in step (c), the time domain feature and the frequency domain feature of the instantaneous current value can also be compared with the reference time domain feature and reference frequency domain feature of the current of the fault arc of the circuit, and "or" in the claims also includes the approach of comparing both of the features.

In particular, in step (a), the current sensor 2 shown in FIG. 1 is used to respectively detect the instantaneous currents of circuits 1, 2 and 3. That is, the current in the circuit is sampled successively n times and n instantaneous current values are acquired, i.e. the value of i(t) is determined, where n is an integer greater than or equal to 3. In step (b), the current peak value is predicted using the n sampled instantaneous current values on the basis of the existing current peak value prediction algorithm. There are several prediction algorithms for predicting the current peak value at present. For example, an algorithm for determining a current peak value $I_{peak}$ disclosed in the commonly assigned published patent application CN 102798753 A (published on 28 Nov. 2012) can be used. The contents of the commonly assigned patent application are herewith incorporated by reference in the entirety. In summary, the algorithm is to predict the current peak value $I_{peak}$ of the circuit using the instantaneous current value on the basis of Ohm's law equation for the circuit, and by means of deduction, the following formula can be obtained:

$$I_{peak} = \sqrt{\frac{P^2 + Q^2}{1 + \gamma^2}} \quad (1)$$

Here, formula (1) comprises a combination of three unknown quantities, namely, P, Q and γ. The values of P, Q and γ can be calculated using instantaneous currents i(t) obtained at at least three time sampling points and corresponding integral values $I(t) = \int i(t)dt$ of i(t). Then the current peak values $I_{peak}$ corresponding to the above-mentioned time sampling points can be calculated. Moreover, a dynamic model using non-linear differentiation, a Verhulst algorithm in a gray prediction model, etc., can be adopted, which will not be illustrated here one by one.

After the predicted current peak value is calculated, the predicted current peak value is compared with a predetermined threshold. When the predicted current peak value is greater than the predetermined threshold, it is determined that a first energy fault arc is to appear. The predetermined threshold can be set according to a current peak value of a fault arc generated by the electrical power system before and can also be obtained by means of empirical research. Here, the first energy fault arc is a high-energy fault arc caused by a short circuit failure. If it is determined that the first energy fault arc is to appear on a circuit (e.g., circuit 1), then the circuit breaker 1 on this circuit can be caused to trip. At the same time, a signal can also be sent to the arc extinguisher 3 on the circuit to cause same to start arc extinguishing.

The algorithm in the above-mentioned step (b) can be embedded in an electronic trip unit (ETU) of the circuit breaker 1, and the algorithm is executed using a processor in the ETU. That is, the circuit breaker 1 can receive the instantaneous current value collected by the current sensor 2, determine the first energy fault arc and the second energy fault arc, and send an action signal to the arc extinguishing device 3 and the ETU in the circuit breaker 1. Certainly, one individual processor can also be arranged to execute this algorithm.

When the similarity between the time domain feature or the frequency domain feature of the instantaneous current and the reference time domain feature or the reference frequency domain feature of the current of the fault arc of the circuit reaches a predetermined range, it is determined that a second energy fault arc appears.

In step (c), the time domain feature or the frequency domain feature of the instantaneous current value is compared with the reference time domain feature or the reference frequency domain feature of the current of the fault arc of the circuit. The current waveform of the fault arc has different characteristics in the time domain and the frequency domain from those of a normal current. For example, in the time domain, the current waveform of the fault arc has features such as asymmetry within positive and negative half cycles, a square shoulder part and a steep waveform. In the frequency domain, there are visible differences between the current waveform of the fault arc and the spectrum components of a normal current. Firstly, typical features of the current waveform of the fault arc of one circuit in the time domain and the frequency domain such as spectrum and amplitudes can be extracted and stored as a reference feature library. When implementing the fault arc detection method of the present invention, the sampled feature of the instantaneous current value in the time domain or frequency domain is compared with a reference feature of the current of the fault arc of the circuit in the time domain or frequency domain in the reference feature library. If the matching degree of the two arrives at a predetermined range, it is determined that the second energy fault arc appears. When it is determined that the second energy fault arc appears on one circuit, the circuit breaker 1 on the circuit can be caused to trip.

It can be seen that the fault arc detection method provided in the embodiments of the present invention is able to predict the fault current peak value before the instantaneous current arrives at the peak value and is thus able to predict the fault arc, thereby avoiding the occurrence of the current peak value and the high-energy fault arc in the circuit, and reducing the damage to the electrical power apparatus and system by the fault arcs.

Figure 3A:
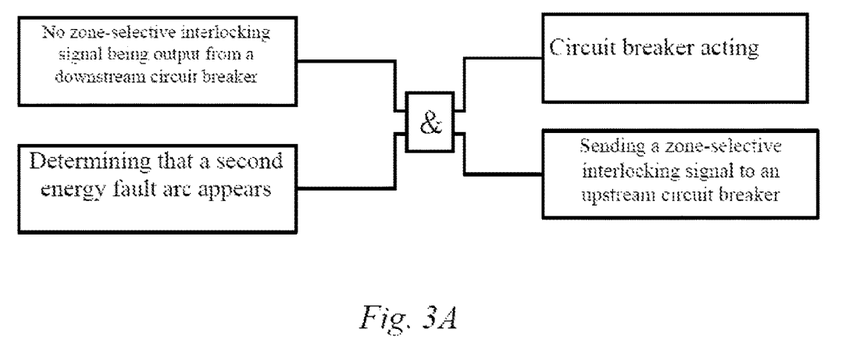
FIGS. 3A and 3B show another preferred embodiment of the present invention.
Figure 3B:
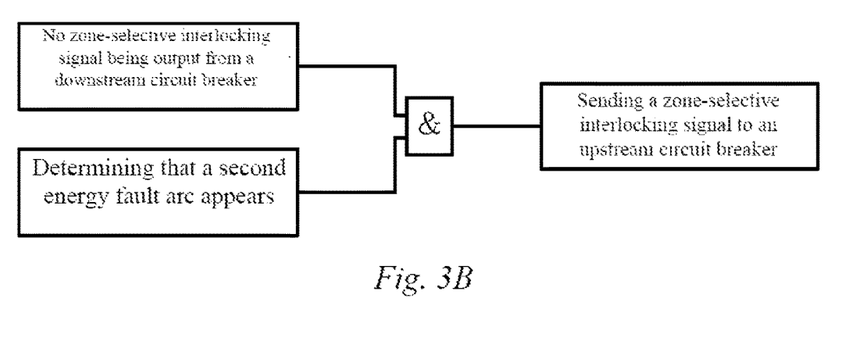

With regard to the circuit breaker 1 having the zone-selective interlocking (ZSI) function, the control logics shown in FIGS. 3A and 3B can be adopted. When it is determined that the second energy fault arc appears on one circuit (circuit 1 is taken as an example below), if circuit 1 does not receive a zone-selective interlocking signal from the downstream circuits (i.e. circuits 2 and 3), then the circuit breaker 1 of circuit 1 is caused to act and the zone-selective interlocking signal is sent to the upstream circuit (not shown in the drawings); and if circuit 1 receives the zone-selective interlocking signals from circuits 2 and 3, then circuit 1 sends the zone-selective interlocking signal to the upstream circuit. It can be seen that when implementing ZSI protection, the present invention is able to detect the occurrence of a short circuit fault arc in time, can protect corresponding circuits earlier and avoid unnecessarily opening the normal circuit.

Figure 4:
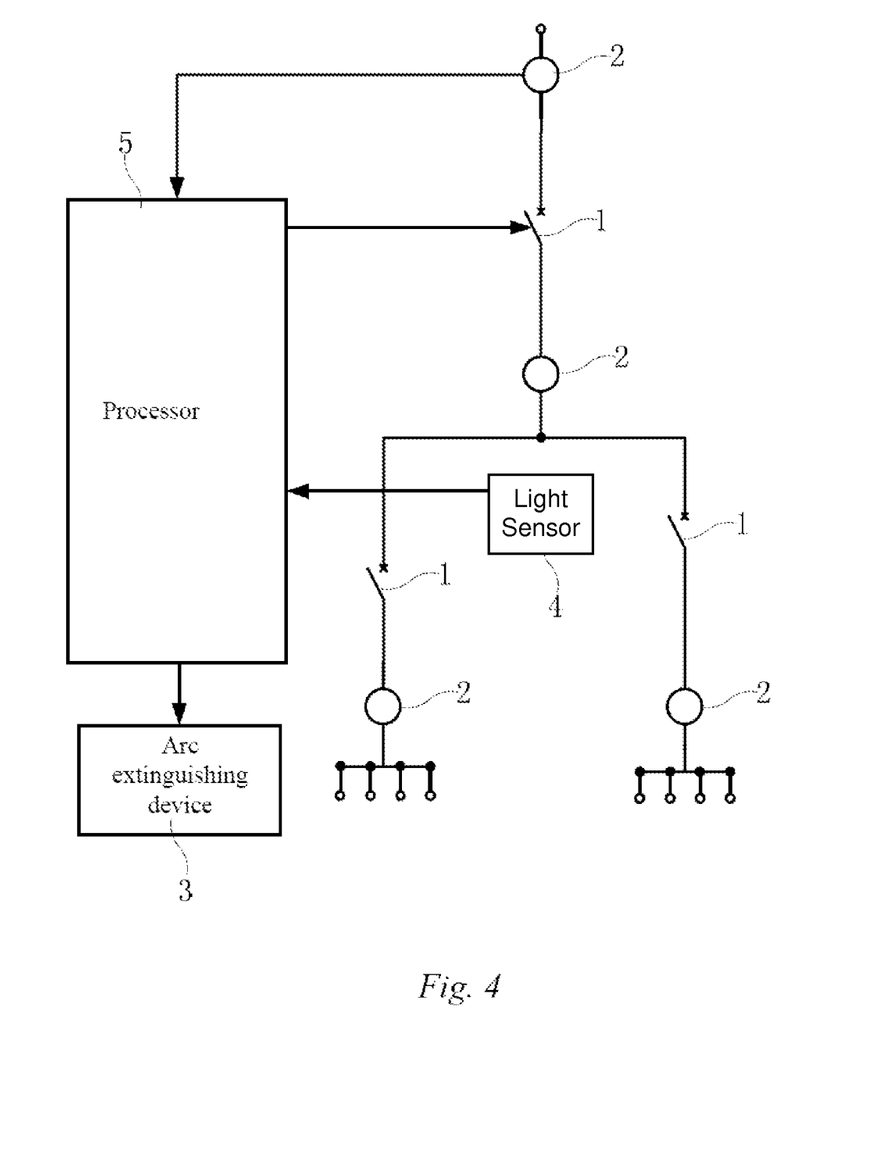
FIG. 4 is a structural schematic diagram of another electrical power system which applies a fault arc detection method of the present invention.

FIG. 4 is a structural schematic diagram of another electrical power system which applies a fault arc detection method of the present invention. The present embodiment further arranges a light sensor 4 for each circuit on the basis of the electrical power system shown in FIG. 2. The light sensor 4 is used for detecting the arc light intensity of the fault arcs. Firstly, a typical light intensity feature of the fault arc of one circuit can be extracted and stored as a reference feature library. When implementing the fault arc detection method of the present invention, the light intensity feature of the arc light of the arc sampled by the light sensor 4 is compared with a reference feature in the above-mentioned reference feature library. When the degree of similarity between the two arrives at a predetermined numerical range and it is determined that the first energy fault arc is to appear in the above-mentioned step (b), the circuit breaker 1 on the corresponding circuit is caused to act and the arc extinguisher 3 of the circuit is caused to act. This embodiment utilizes two conditions, i.e. the arc light intensity feature of the arc and the predicted current peak value of the fault circuit, to determine whether it is required to cause the circuit breaker 1 and the arc extinguisher 3 to act, thereby further decreasing erroneous operations of the circuit breaker 1 and the arc extinguisher 3.

The algorithm in the above step (b) can be embedded into the ETU of the circuit breaker 1, and the algorithm is executed using the ETU. Certainly, one individual processor can also be arranged to execute this algorithm. In FIG. 4, a processor 5 is used to represent an ETU embedded with this algorithm or an individual processor. The processor 5 also receives the instantaneous current value collected by the current sensor 1 and a light intensity signal collected by the light sensor 4, and also sends an action signal to the circuit breaker 1 and the arc extinguisher 3 at the same time.

In the above-mentioned embodiment, in addition to using the light sensor, a noise sensor, a radio-frequency temperature sensor, etc., can also be used to collect typical physical features of the arc, so that whether the circuit breaker 1 and the arc extinguisher 3 are caused to act is determined by comparing the collected typical physical features of the arc and the features in the reference feature library.

Figure 5:
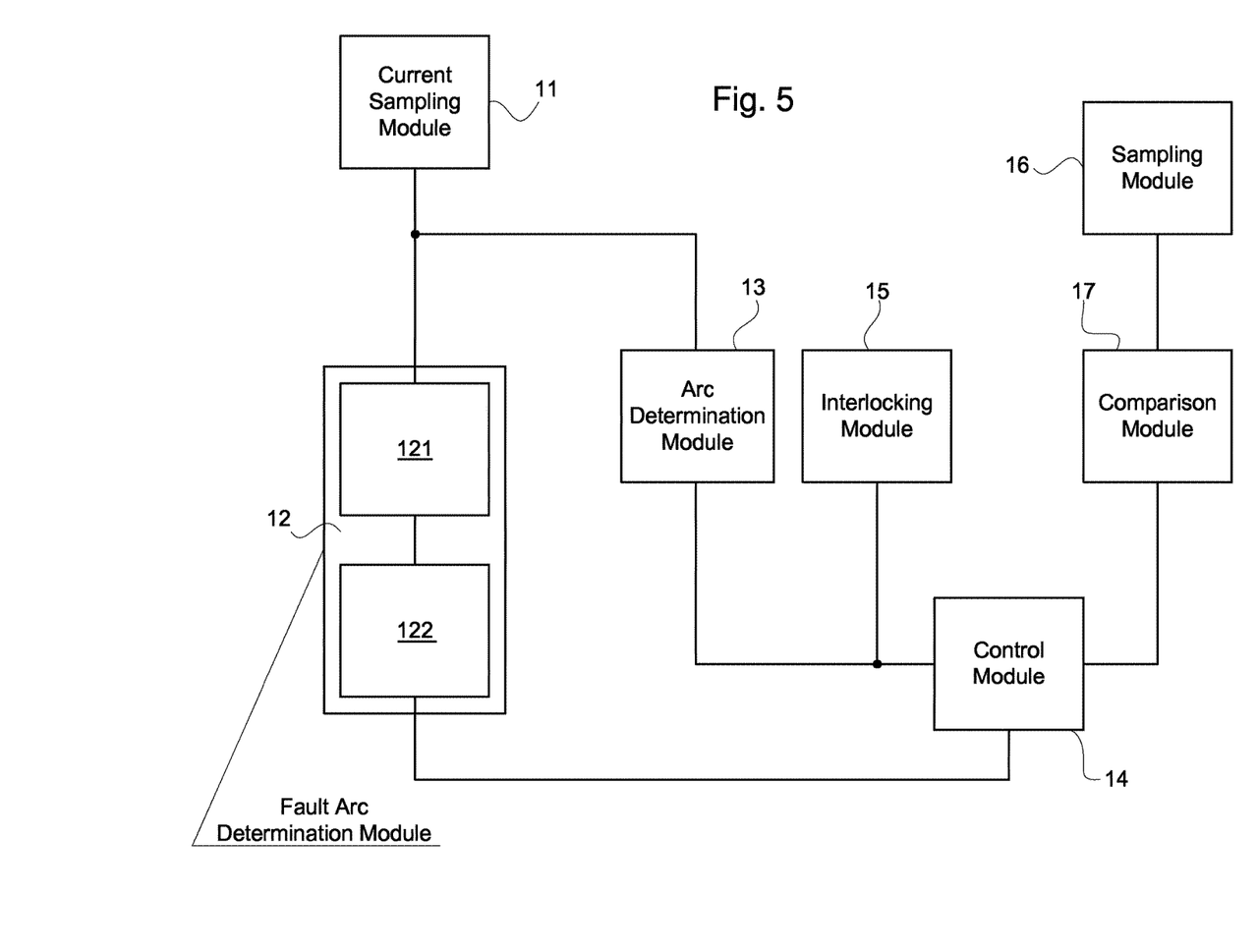
FIG. 5 is a structural schematic diagram of a fault circuit detection device in the embodiments of the present invention.

FIG. 5 is a structural schematic diagram of a fault circuit detection device in the embodiments of the present invention. As shown in FIG. 5, the detection device comprises: a current sampling module 11 for sampling an instantaneous current value of a circuit; a first energy fault arc determination module 12 for using the instantaneous current value to predict a current peak value and, when the predicted current peak value is greater than a predetermined threshold, determining that a first energy fault arc is to appear; and a second energy fault arc determination module 13 for comparing sampled features of the instantaneous current value in the time domain and the frequency domain with reference features of the current of the fault arc of the circuit in the time domain and the frequency domain in a reference feature library, and when the degree of similarity between the sampled features of the instantaneous current in the time domain and the frequency domain and the reference features of the current of the fault arc of the circuit in the time domain and the frequency domain arrives at a predetermined range, determining that the second energy fault arc appears.

The first energy fault arc determination module 12 can further comprise: a current integral value acquisition module 121 for acquiring current integral values corresponding to sampling moments of the instantaneous current value; and a current peak value $I_{peak}$ prediction module 122 for using the instantaneous current value and the current integral value to predict the current peak value $I_{peak}$ of the circuit based on an Ohm's law equation for the circuit, and when the predicted current peak value $I_{peak}$ of the circuit is greater than the predetermined threshold, determining that the first energy fault arc is to appear.

The detection device further comprises a logical control module 14 and a zone-selective interlocking module 15. The logical control module 14 and the zone-selective interlocking module 15 can be implemented by the ETU of the circuit breaker 1 and can also be implemented by one individual processor. When the second energy fault arc determination module 13 determines that the second energy fault arc appears, and the circuit does not receive a zone-selective interlocking signal from a downstream circuit, the logical control module 14 causes a circuit breaker of the circuit to act, and sends the zone-selective interlocking signal to an upstream circuit; and if the circuit receives the zone-selective interlocking signal from the downstream circuit, the logical control module 14 sends the zone-selective interlocking signal to the upstream circuit.

The detection device further comprises an arc physical feature sampling module 16 and a physical arc feature comparison module 17. The arc physical feature sampling module 16 is used for sampling a physical feature generated by an arc of the circuit. The arc physical feature comparison module 17 is used for comparing the sampled physical feature of the arc of the circuit with the reference feature of the fault arc of the circuit in the reference feature library. When the similarity between the sampled physical feature and the reference feature of the fault arc of the circuit reaches the predetermined range and the first energy fault arc determination module 12 determines that the first energy fault arc is to appear, the logical control module 14 causes the circuit breaker and an arc extinguisher on the circuit to act.

A person skilled in the art knows that various modules of the above-mentioned detection device can not only be implemented using software but also using a hardware circuit such as a field programmable gate array (FPGA), an ASIC chip and a complex programmable logic device (CPLD).

Table 1 below lists verification results of the present invention. In table 1, 11 test samples are illustrated, wherein these samples are obtained according to international standard IEC/TR 61641: Enclosed low-voltage switchgear and control gear assemblies—Guide for testing under conditions of arcing due to internal fault. The first column in the table is the file names of the test samples, the second column is a phase name of a three-phase power supply, the third column is the time for detecting a fault arc according to the fault arc detection method and device of the present invention, the fourth column is the time for detecting a fault arc according to the existing real-time current, and the fifth column is the difference between the time required for the present invention to detect a fault arc and the time required for detecting a fault arc according to the real-time current. These test samples verify that the present invention is able to significantly decrease the time for detecting the fault arc.

| File name | Phase name | Detection time according to the present invention | Detection time according to real-time current | Time difference |
|---|---|---|---|---|
| 1081196 | A | 1.2 | 3.44 | 2.24 |
| 1081196 | B | 1.2 | 1.48 | 0.28 |
| 1081196 | C | 1.2 | 1.64 | 0.44 |
| 1081199 | A | 2.36 | 3.02 | 0.66 |
| 1081199 | B | 1.18 | 1.36 | 0.18 |
| 1081199 | C | 1.18 | 1.42 | 0.24 |
| 1081200 | A | 2.62 | 2.96 | 0.34 |
| 1081200 | B | 1.18 | 1.36 | 0.18 |
| 1081200 | C | 1.18 | 1.4 | 0.22 |
| 1081201 | A | 3.84 | 4.22 | 0.38 |
| 1081201 | B | 1.18 | 1.36 | 0.18 |
| 1081201 | C | 1.18 | 1.42 | 0.24 |
| 1081202 | A | 2.8 | 3.8 | 1 |
| 1081202 | B | 1.18 | 1.38 | 0.2 |
| 1081202 | C | 1.18 | 1.44 | 0.26 |
| 1081203 | A | 2.16 | 2.74 | 0.58 |
| 1081203 | B | 1.18 | 1.38 | 0.2 |
| 1081203 | C | 1.18 | 1.44 | 0.26 |
| 1081204 | A | 2.32 | 5.62 | 3.3 |
| 1081204 | B | 1.18 | 1.4 | 0.22 |
| 1081204 | C | 1.18 | 1.36 | 0.18 |
| 1081213 | A | 3.14 | 4.8 | 1.66 |
| 1081213 | B | 1.18 | 1.62 | 0.44 |
| 1081213 | C | 1.18 | 1.48 | 0.3 |
| 1081214 | A | 2.82 | 4.74 | 1.92 |
| 1081214 | B | 1.18 | 1.58 | 0.4 |
| 1081214 | C | 1.18 | 1.46 | 0.28 |
| 1081215 | A | 4.9 | 5.36 | 0.46 |
| 1081215 | B | 1.18 | 1.64 | 0.46 |
| 1081215 | C | 1.18 | 1.48 | 0.3 |
| 1081216 | A | 3.32 | 5.24 | 1.92 |
| 1081216 | B | 1.18 | 1.64 | 0.46 |
| 1081216 | C | 1.18 | 1.48 | 0.3 |

It will be understood that the above description deals merely with preferred embodiments of the present invention, but it is not intended to limit the scope of protection of the present invention. In a particular implementation process, an appropriate improvement can be performed according to a preferred embodiment of the present invention so as to adapt to specific needs of specific circumstances. Therefore, it should be understood that the particular implementations of the present invention mentioned here only serve as demonstrations, and they are not intended to limit the scope of protection of the present invention.

The invention claimed is:

1. A fault arc detection method, which comprises:
   (a) sampling an instantaneous current value of a circuit;
   (b) using the instantaneous current value to predict a current peak value and, determining that a first energy fault arc is to appear in response to determining that the predicted current peak value is greater than a predetermined threshold; and
   (c) comparing a time domain feature or a frequency domain feature of the instantaneous current value with a reference time domain feature or a reference frequency domain feature of the current of a fault arc of the circuit and, if a similarity between the time domain feature or the frequency domain feature of the instantaneous current and the reference time domain feature or the reference frequency domain feature of the current of the fault arc of the circuit reaches a predetermined range, determining that a second energy fault arc appears.

2. The detection method according to claim 1, which further comprises: performing step (b), wherein step (b) further comprises:
   (b1) acquiring a current integral value corresponding to a sampling time of the instantaneous current value; and
   (b2) using the instantaneous current value and the current integral value to predict the current peak value $I_{peak}$ of the circuit based on an Ohm's law equation for the circuit; and
   if the current peak value $I_{peak}$ of the circuit is greater than the predetermined threshold, determining that the first energy fault arc is to appear.

3. The detection method according to claim 1, which comprises causing a circuit breaker of the circuit to act when it is determined that the first energy fault arc is to appear.

4. The detection method according to claim 3, which comprises causing an arc extinguisher to act on the circuit when it is determined that the first energy fault arc is to appear.

5. The detection method according to claim 1, which comprises causing a circuit breaker of the circuit to act when it is determined that the second energy fault arc appears.

6. The detection method according to claim 1, wherein the circuit comprises a circuit breaker having a zone-selective interlocking function and the method further comprises:
   when it is determined that the second energy fault arc appears:
   if the circuit does not receive a zone-selective interlocking signal from a downstream circuit, causing the circuit breaker of the circuit to act, and sending a zone-selective interlocking signal to an upstream circuit; and
   if the circuit receives the zone-selective interlocking signal from the downstream circuit, transmitting the zone-selective interlocking signal from the circuit to the upstream circuit.

7. The detection method according to claim 1, the method further comprising:
   sampling a physical feature of the arc of the circuit;
   comparing the sampled physical feature of the arc of the circuit with a reference physical feature library of the fault arc of the circuit; and
   when a similarity between the sampled physical feature and a reference physical feature of the fault arc of the circuit reaches a predetermined range and it is determined in step that the first energy fault arc is to appear, causing a circuit breaker and an arc extinguisher on the circuit to act.

8. A machine-readable storage medium, comprising computer-executable instructions stored thereon in non-transitory form and configured for causing a machine to carry out the method according to claim 1 when the instructions are executed on the machine.

9. A computer program, comprising computer-executable code which, upon being executed in a machine, cause the machine to carry out the method according to claim 1.

10. A fault arc detection device, comprising:
    a current sampling module for sampling an instantaneous current value of a circuit;
    a first energy fault arc determination module configured for using the instantaneous current value to predict a current peak value and, when the predicted current peak value is greater than a predetermined threshold, determining that a first energy fault arc is to appear; and a second energy fault arc determination module configured for comparing a time domain feature or a frequency domain feature of the instantaneous current value with a reference time domain feature or a reference frequency domain feature of the current of a fault arc of the circuit and, when the similarity between the time domain feature or the frequency domain feature of the instantaneous current and the reference time domain feature or the reference frequency domain feature of the current of the fault arc of the circuit reaches a predetermined range, for determining that a second energy fault arc appears.

11. The detection device according to claim 10, wherein said first energy fault arc determination module further comprises:

a current integral value acquisition module for acquiring a current integral value corresponding to a sampling time of the instantaneous current value; and a current peak value prediction module for using the instantaneous current value and the current integral value to predict the current peak value of the circuit based on an Ohm's law equation for the circuit, and when the predicted current peak value of the circuit is greater than the predetermined threshold, determining that the first energy fault arc is to appear.

12. The fault arc detection device according to claim 10, further comprising:

a logical control module and a zone-selective interlocking module connected to said logical control module and wherein:

when said second energy fault arc determination module determines that the second energy fault arc appears, and the circuit does not receive a zone-selective interlocking signal from a downstream circuit, said logical control module causes a circuit breaker of the circuit to act, and sends a zone-selective interlocking signal to an upstream circuit; and if the circuit receives the zone-selective interlocking signal from the downstream circuit, said logical control module sends the zone-selective interlocking signal to the upstream circuit.

13. The fault arc detection device according to claim 12, further comprising:

an arc physical feature sampling module for sampling a physical feature generated by an arc of the circuit; and an arc physical feature comparison module for comparing the sampled physical feature of the arc of the circuit with a reference feature of the fault arc of the circuit, and when a similarity between the sampled physical feature and the reference feature of the fault arc of the circuit reaches the predetermined range and said first energy fault arc determination module determines that the first energy fault arc is to appear, said logical control module causes a circuit breaker and an arc extinguisher on the circuit to act.

* * * * *